United States Patent
Nakamura

(10) Patent No.: US 6,472,958 B2
(45) Date of Patent: Oct. 29, 2002

(54) INPUT CIRCUIT OF SATELLITE TUNER

(75) Inventor: Naohito Nakamura, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/764,714

(22) Filed: Jan. 17, 2001

(65) Prior Publication Data

US 2001/0008386 A1 Jul. 19, 2001

(30) Foreign Application Priority Data

Jan. 19, 2000 (JP) ........................... 2000-014047

(51) Int. Cl.[7] .................................................. H03H 7/00
(52) U.S. Cl. ........................ 333/181; 455/286; 455/63; 333/12
(58) Field of Search ...................... 333/181, 12; 455/63, 455/286

(56) References Cited

U.S. PATENT DOCUMENTS 3,965,426 A * 6/1976 Ringland .................... 325/375
5,068,631 A * 11/1991 Vince ......................... 333/181
5,719,750 A * 2/1998 Iwane ......................... 361/794

FOREIGN PATENT DOCUMENTS

| EP | 1129881 | 3/1992 | ............ H04N/5/44 |
| EP | 0408451 | 10/1999 | ............ H03N/7/46 |

* cited by examiner

Primary Examiner—Justin P. Bettendorf
Assistant Examiner—Damian Cathey
(74) Attorney, Agent, or Firm—Jay H. Maioli

(57) ABSTRACT

A circuit that prevents a receiving signal from leaking to an LNB supply line to thereby deteriorate input VSWR characteristic includes a capacitor of about 1000 pF for removing noise and a capacitor of about 1 pF for passing a high frequency component which leaks to an LNB voltage supply line to the ground provided between the LNB voltage supply line and the ground. By the capacitor of about 1000 pF, a noise component included in the LNB voltage supply line is removed. Further, by the capacitor of about 1 pF, the high frequency signal component which leaks via a choke coil is bypassed to thereby reduce impedance of a node NA over a broad band and prevent a reflecting wave from being produced at the node NA and input VSWR from being deteriorated.

15 Claims, 3 Drawing Sheets

INPUT CIRCUIT OF SATELLITE TUNER

BACKGROUND OF THE INVENTION

1. Field of the Invention

The present invention particularly relates to an input circuit of a satellite tuner for receiving satellite broadcasting.

2. Description of the Related Art

A parabolic antenna for receiving satellite broadcasting is attached with LNB (Low Noise Block Down Converter) for converting a signal from a satellite transmitted by, for example, 12 GHz band into a signal of a frequency of, for example, 1 GHZ through 2 GHz band. Power source for LNB is transmitted from a tuner side via a coaxial cable and an input stage of a tuner circuit of satellite broadcasting is provided with a circuit for supplying power source to LNB side.

FIG. 1 shows a constitution of an input stage of a conventional tuner 101 of satellite broadcasting. As shown in FIG. 1, the input stage of the conventional tuner 101 of satellite broadcasting is provided with an antenna terminal 102, a high pass filter 111, a choke coil 112 and a capacitor 113. The antenna terminal 102 is for connecting LNB 104 attached to a parabolic antenna 103 via a coaxial cable 105 and as the antenna terminal 102, for example, an F type connector is used. The capacitor 113 is a ceramic capacitor of a chip part of, for example, about 1000 pF.

A signal of, for example, 12 GHz band from a satellite is received by the parabolic antenna 103. The received signal is converted into a signal of, for example, 1 GHz through 2 GHz band by LNB 104 and is inputted to the antenna terminal 102 via the coaxial cable 105. Further, the input signal is supplied to an initial stage amplifier via the high pass filter 111.

Power source for LNB 104 is outputted through an LNB voltage supply line 114 and from the antenna terminal 102 via the choke coil 112 and is transmitted to LNB 104 via the coaxial cable 105.

The high pass filter 11 is provided for extracting a high frequency signal component inputted from the antenna terminal 102 and transmitting the high frequency signal component to the initial stage amplifier. The choke coil 112 is provided for cutting the high frequency signal component inputted from the antenna terminal 102. Further, the capacitor 113 is for removing a noise component included in the LNB voltage supply line 114. Particularly, in the case of a tuner of a digital satellite broadcasting, there is a case in which a clock component or the like plunges into the LNB voltage supply line 114. The capacitor 113 operates as a bypass capacitor for preventing a noise component of several hundreds MHz or lower such as a clock component from flowing to a signal path.

As described above, the input stage of the tuner 101 of satellite broadcasting is provided with the circuit for supplying power source to the side of LNB 104 and the choke coil 112 is provided between the antenna terminal 102 and the LNB voltage supply line 114 in series therewith such that a high frequency signal component does not flow to the side of the LNB voltage supply line 114. Further, the capacitor 113 of about 1000 pF is provided between the LNB voltage supply line 114 and the ground for the purpose of cutting noise.

The choke coil 112 is formed as a pattern on a microstrip in view of small size formation and no adjustment formation and accordingly, it is difficult to form a constitution having large inductance because of a space-related problem. Therefore, it is difficult to completely cut a high frequency signal component from the antenna terminal 102 by the choke coil 112 and there is a case in which a high frequency signal component inputted from the antenna input terminal 102 leaks to the LNB voltage supply line 114 via the choke coil 112.

Although the capacitor 113 is provided between the LNB voltage supply line 114 and the ground, according to the capacitor 113, there is used a constitution having comparatively large capacitance of about 1000 pF in order to remove noise of several hundreds MHz. However, in the case of such a capacitor having comparatively large capacitance, impedance with respect to a high frequency signal component is large and the high frequency signal component which leaks to the LNB voltage supply line 114 cannot be bypassed. Therefore, reflection occurs at a node NA, which deteriorates input VSWR (Voltage Standing Wave Ratio) characteristic.

That is, actually, the capacitor 113 is not only provided with a complete capacitance component but is provided also with an inductance component. Therefore, there is present a self-resonance frequency.

In the case of a capacitor of about 1000 pF, the inductance component becomes large and the self-resonance frequency becomes several hundreds MHz. Therefore, it seems that the capacitor 113 operates as an inductance component with respect to a high frequency signal of about 1 GHz. Therefore, the impedance of the node NA becomes large with respect to a high frequency signal. As a result, a high frequency component which flows in via the choke coil 112, leaks to the LNB voltage supply line 114 and reflection occurs at the point of the node NA which deteriorates the input VSWR characteristic.

SUMMARY OF THE INVENTION

The present invention provides a constitution capable of improving a receiving characteristic of an input unit.

According to the present invention, there is provided an input circuit of a satellite tuner comprising:

- an antenna terminal for connecting to an outside converter via a cable;
- a high pass filter for extracting a high frequency signal component from the outside converter transmitted via the cable and transmitting the extracted high frequency signal to an initial stage circuit;
- a power source supply line supplied with a power source for providing a power source for the outside converter via the cable:
- a choke coil inserted between the power source supply line and the antenna terminal for preventing the high frequency signal component from the outside converter transmitted via the cable and transmitting the power source from the power source supply line to the antenna terminal;
- a first capacitor connected between the power source supply line and ground for removing influence of a noise component included in the power source transmitted to the power source supply line; and
- a second capacitor connected between the power source supply line and the ground for removing influence of the high frequency signal component which leaks in via the choke coil.

There are provided the capacitor of about 1000 pF for removing noise and the capacitor of about 1 pF for flowing the high frequency component which leaks to the LNB supply line to the ground between the LNB voltage supply line and the ground. By operation of the capacitor of about 1 pF, impedance of a node NA between the LNB voltage supply and the choke coil is reduced in a broad band and deterioration of input VSWR can be prevented.

DETAILED DESCRIPTION OF THE PREFERRED EMBODIMENTS

Figure 1:
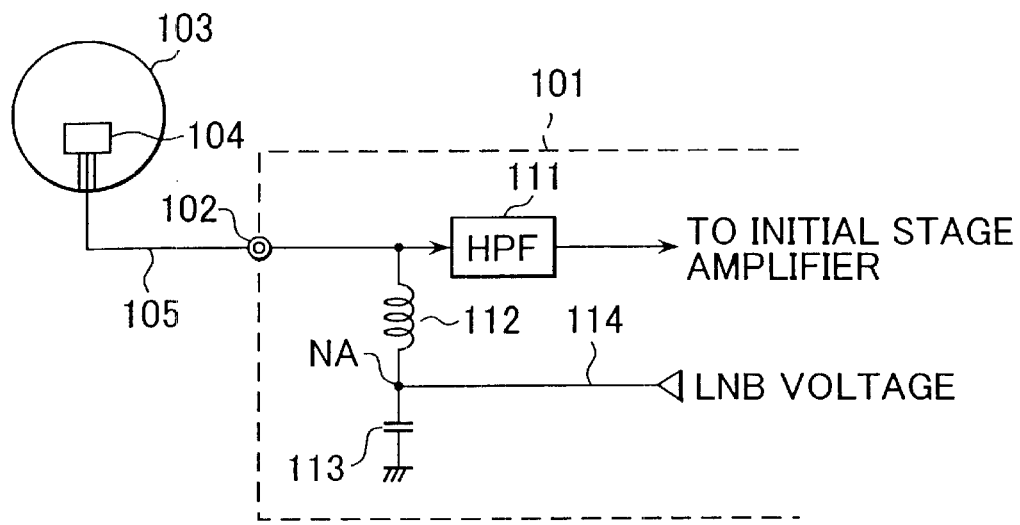
FIG. 1 is a connection diagram showing a constitution of an input stage of a related satellite broadcasting tuner.
Figure 2:
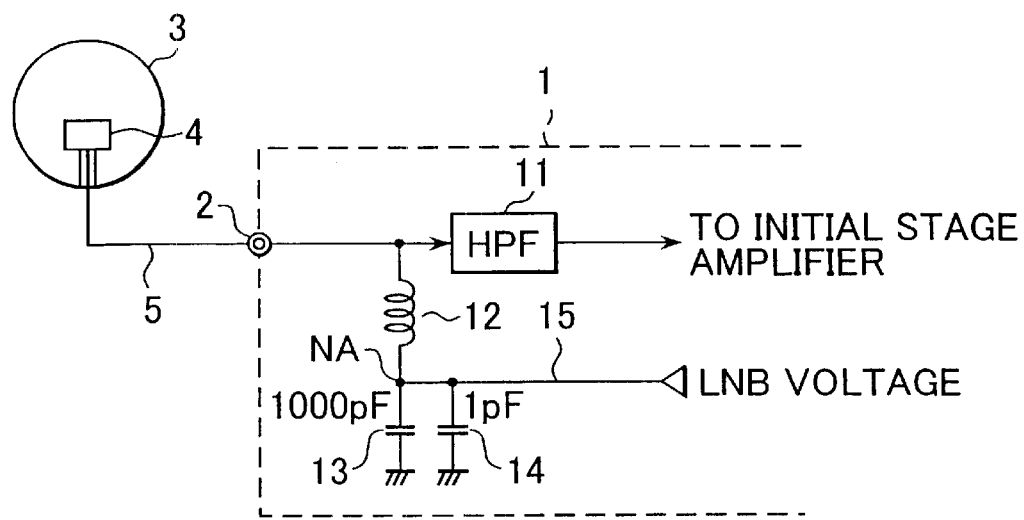
FIG. 2 is a connection diagram showing a constitution of an input stage of a satellite broadcasting tuner to which the present invention is applied.

An explanation will be given of embodiments of the present invention in reference to the drawings as follows. FIG. 2 shows a constitution of an input stage of a satellite broadcasting tuner to which the present invention is applied.

In FIG. 2, an antenna terminal 2 is provided at an input stage of a tuner 1 of satellite broadcasting. The antenna terminal 2 is for connecting to LNB 4 attached to a parabolic antenna 3 via a coaxial cable 5. As the antenna terminal 2, for example, an F type connector is used.

The antenna terminal 2 is connected to an input end of a high pass filter 11 and is connected to one end of a choke coil 12. The other end of the high pass filter 11 is connected to an initial stage amplifier (not illustrated). The other end of the choke coil 12 is connected to one end of a capacitor 13 and one end of a capacitor 14 and is connected to an LNB voltage supply line 15. Other ends of the capacitor 13 and the capacitor 14 are grounded. The capacitor 13 is of a constitution having capacitance of about 1000 pF and the capacitor 14 is of a constitution having capacitance of about 1 pF. As the capacitors 13 and 14, ceramic capacitors of chip parts are used.

In satellite broadcasting, a signal is transmitted by radio wave of, for example, 12 GHz band. The signal from a satellite is received by the parabolic antenna 3. The received signal is converted into a signal of, for example, 1 GHz band by LNB 4 and is transmitted to the side of the tuner 1 via the coaxial cable 5. Further, the high frequency signal transmitted via the coaxial cable 5 is supplied to the antenna terminal 2 of the tuner 1 and the high frequency signal from the antenna terminal 2 is supplied to an initial stage amplifier (not illustrated) via the high pass filter 111.

Further, power source for LNB 4 attached to the parabolic antenna 3 is transmitted from the side of the tuner via the coaxial cable 5. For supplying power source voltage to LNB 4, direct current power source voltage is flowed to the LNB voltage supply line 15. The power source voltage from the LNB voltage supply line 15 is outputted from the antenna terminal 2 via the choke coil 12 and is transmitted to LNB 4 via the coaxial cable 5.

In this way, according to the tuner 1 of satellite broadcasting, it is necessary to transmit the power source voltage to LNB 4 and accordingly, the coaxial cable 5 is transmitted with the high frequency signal from LNB 4 to the side of the tuner 1 and transmitted with the power source voltage from the tuner 1 of satellite broadcasting to LNB 4. The high pass filter 11 in FIG. 2 is provided for extracting only a high frequency signal component from the antenna terminal 2 and transmitting the high frequency signal component to the initial stage amplifier. The choke coil 12 is provided for transmitting only the direct current power source voltage from the LNB voltage supply line 15 from the antenna terminal 2 to LNB 4 via the coaxial cable 5 and preventing the high frequency signal component inputted from the antenna terminal 2 from leaking to the LNB voltage supply line 15.

Further, according to the example, there are provided the capacitor 13 of about 1000 pF and the capacitor 14 of about 1 pF between the LNB voltage supply line 15 and the ground.

The capacitor 13 of about 1000 pF is for removing a noise component included in the LNB voltage supply line 15. That is, the capacitor 13 is operated as a bypass capacitor for preventing a noise component of several hundreds MHz or lower such as a clock component from flowing to a signal path.

The capacitor 14 of about 1 pF is for bypassing a high frequency signal component which leaks via the choke coil 12 to thereby reduce impedance of the node NA over a broad band and preventing input VSWR from being deteriorated by producing a reflecting wave at the node NA.

That is, the choke coil 12 is formed as a pattern on a microstrip line and therefore, it is difficult to form a constitution having large inductance. Therefore, it is difficult to completely cut the high frequency signal component from the antenna terminal 2 by the choke coil 12 and there is a case in which the high frequency signal component inputted from the antenna input terminal 2 leaks to the LNB voltage supply line 15 via the choke coil 12.

The capacitor 13 between the LNB voltage supply line 15 and the ground is of about 1000 pF and operates as an inductance component with respect to a high frequency signal and accordingly, the high frequency signal flowed to the node NA is not bypassed via the capacitor 13. As a result, the higher the frequency, the more increased is the impedance of the node NA, a reflecting wave is produced there and the VSWR characteristic is deteriorated.

By providing the capacitor 14 of about 1 pF between the LNB voltage supply line 15 and the ground, the high frequency signal flowed to the node NA is bypassed via the capacitor 14, the impedance of the node NA is reduced and the input VSWR characteristic is improved.

A further explanation will be given of the fact that by providing the capacitor 14 of about 1 pF between the LNB voltage supply line 15 and the ground, the impedance of the node NA is reduced over a broad band and the input VSWR is improved.

Figure 3:
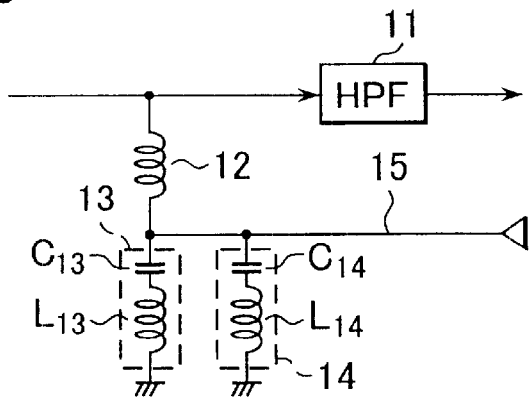
FIG. 3 is an equivalent circuit diagram used for explaining the input stage of the satellite broadcasting tuner to which the present invention is applied.

As the capacitors 13 and 14, there are used ceramic capacitors of chip parts and actually, the capacitors 13 and 14 include not only complete capacitance components but also inductance components. Therefore, when the capacitors 13 and 14 are expressed by an equivalent circuit, as shown in FIG. 3, the capacitor 13 is expressed by a capacitance component $C_{13}$ and an inductance component $L_{13}$ and the capacitor 14 is expressed by a capacitance component $C_{14}$ and an inductance component $L_{14}$. Therefore, the capacitor 13 and the capacitor 14 are provided with self-resonance frequencies respectively determined by the capacitance component $C_{13}$ and the inductance component $L_{13}$, and the capacitance component $C_{14}$ and the inductance component $L_{14}$. Although the capacitors 13 and 14 are capacitors as elements, the capacitors 13 and 14 become capacitive (capacitance) at frequencies lower than the self-resonance frequencies and become inductive (inductance) at frequencies higher than the self-resonance frequencies.

Figure 4:
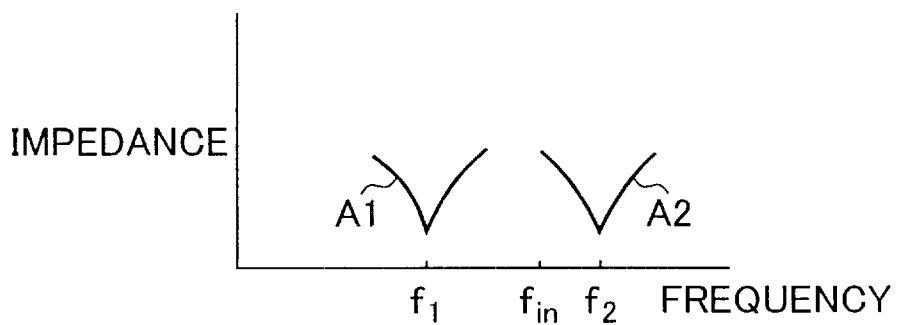
FIG. 4 is a graph used for explaining the input stage of the satellite broadcasting tuner to which the present invention is applied.

FIG. 4 explains the self-resonance frequencies of the capacitor 13 and the capacitor 14, notation A1 designates a characteristic of the capacitor 13 and notation A2 designates a characteristic of the capacitor 14. As shown in FIG. 4, the capacitor 13 is of about 1000 pF and accordingly, the inductance component is also large and the self-resonance frequency $f_1$ is disposed at several hundreds MHz of a frequency lower than a frequency $f_{in}$ (1 GHz through 2 GHz) of the high frequency signal inputted to the tuner. The capacitor 14 is of about 1 pF and accordingly, the inductance component is also small and a self-resonance frequency $f_2$ is disposed at several GHz of a frequency higher than the frequency $f_{in}$ of the high frequency signal inputted to the tuner.

In this way, the self-resonance frequency $f_1$, of the capacitor 13 becomes the frequency lower than the frequency $f_{in}$ of the high frequency signal inputted to the tuner and although the capacitor 13 is a capacitor as an element, the capacitor 13 is provided with an inductive characteristic with respect to the high frequency signal inputted to the tuner and constitutes large impedance. In the meantime, the self-resonance frequency $f_2$ of the capacitor 14 becomes the frequency higher than the frequency $f_{in}$ of the high frequency signal inputted to the tuner, is provided with a capacitive characteristic with respect to the high frequency signal inputted to the tuner and constitutes small impedance.

Figure 5A:
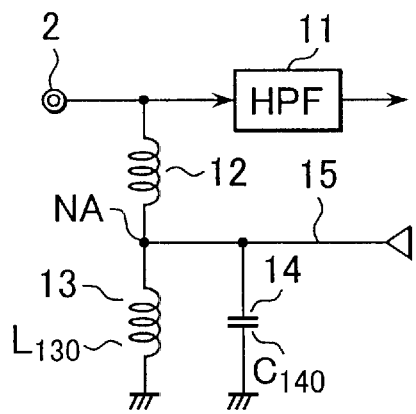
FIGS. 5A and 5B illustrate equivalent circuit diagrams used for explaining the input stage of the satellite broadcasting tuner to which the present invention is applied.
Figure 5B:
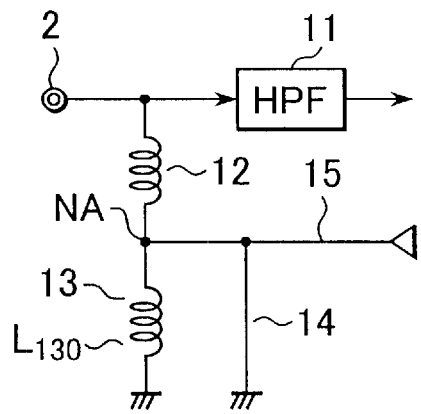

Therefore, with respect to the inputted high frequency signal, as shown in an equivalent circuit of FIG. 5A, the capacitor 13 operates as an inductance component $L_{130}$ and the capacitor 13 operates as a capacitance component $C_{140}$. When the impedance of the capacitance component $C_{140}$ with respect to the high frequency signal is regarded as negligible, the constitution becomes as shown in FIG. 5B, the high frequency signal which leaks from the antenna input terminal 2 via the choke coil 12, is grounded via the capacitor 14, the impedance of the node NA is reduced and deterioration of input VSWR can be prevented.

In this way, according to the embodiment of the present invention, there are provided the capacitor 13 of about 1000 pF and the capacitor 14 of about 1 pF between the LNB voltage supply line 15 and the ground. By operation of the capacitor 14, the impedance of the node NA is reduced and deterioration of input VSWR can be prevented.

Further, the tuner 1 is constituted mainly on a microstrip line and when other ends of the capacitors 13 and 14 are grounded, the other ends of the capacitors 13 and 14 are often connected to a ground face on a rear side of a substrate via through holes. Such through holes constitute large inductance components at high frequency and becomes a factor of increasing the impedance of the node NA.

Figure 6:
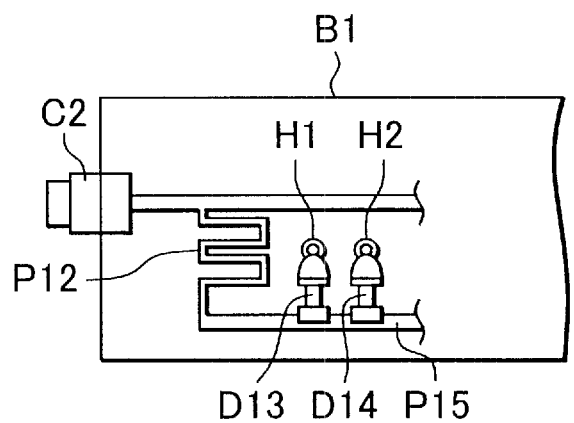
FIG. 6 is a plane view for explaining the input stage of the satellite broadcasting tuner to which the present invention is applied.

That is, FIG. 6 shows a specific constitution of the input stage of the tuner 1 of broadcasting shown in FIG. 2. As shown in FIG. 6, the antenna terminal 2 becomes an F type connector C2, the choke coil 12 becomes a pattern P12 on the microstrip line and the capacitors 13 and 14 become chip capacitors D13 and D14.

Ends on one side of the chip capacitors D13 and D14 are connected to a pattern P15 of the LNB voltage supply line and ends on other side thereof are connected to a ground face of a rear face of a substrate B1 via through holes H1 and H2. The through holes H1 and H2 constitute large inductance components at high frequency and the inductance components by the through holes H1 and H2 are not negligible when a thickness of the substrate B1 becomes large.

Figure 7A:
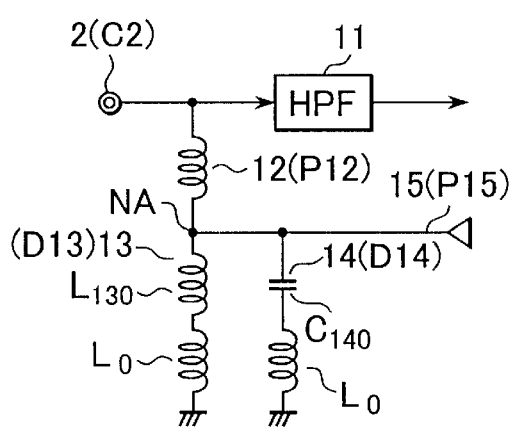
FIGS. 7A and 7B illustrate equivalent circuit diagrams used for explaining the input stage of the satellite broadcasting tuner to which the present invention is applied.
Figure 7B:
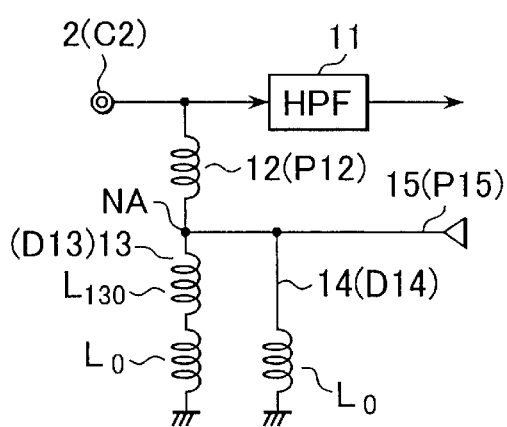

When the inductance components of the through H1 and H2 are designated by notation $L_0$ and as described above, when the inductance component of the capacitor 13 (chip capacitor D13) with respect to the inputted high frequency signal is designated by notation $L_{130}$ and the capacitance component of the capacitor 14 (chip capacitor D14) is designated by notation $C_{140}$, in consideration of the inductances by the through holes, an equivalent circuit at a portion of the node NA is as shown in FIG. 7A. In this case, when the impedance by the capacitance component $C_{140}$ of the capacitor 14 is made to be negligible, the equivalent circuit becomes as shown in FIG. 7B and the impedance Z of the node NA is calculated by the following equation.

$$Z = \frac{j\omega(L_0 + L_{130}) \cdot j\omega L_0}{j\omega(L_0 + L_{130}) + j\omega L_0} \qquad \text{[Equation 1]}$$

$$= \frac{-\omega^2 L_0(L_0 + L_{130})}{j\omega(2L_0 + L_{130})}$$

$$= \frac{j\omega L_0(L_0 + L_{130})}{2L_0 + L_{130}}$$

$$= j\omega L_0 - \frac{j\omega L_0^2}{2L_0 + L_{130}}$$

From the Equation, $$z < j\omega L_0$$

it can be understood by inserting the capacitor 14 in parallel with the capacitor 13, in comparison with the case of a single capacitor, the impedance Z of the node NA can be reduced and influence of the inductance components $L_0$ by the through holes can also be reduced.

Further, although according to the above-described example, the present invention is applied to the input stage of the tuner circuit of satellite broadcasting, the present invention is applicable also to other apparatus having a constitution of transmitting a high frequency signal and supplying power source via a transmission path.

Further, although according to the above-described example, there are provided the capacitor 13 of about 1000 pF and the capacitor 14 of about 1 pF between the LNB voltage supply line 15 and the ground, the present invention is not limited to capacitors having such capacitances. Particularly, even in the case of capacitors having the same capacitance, inductance components thereof differ, at a high frequency, there are added various factors such as arrangement of parts, way of providing through holes;, shapes of patterns and so on and accordingly, optimum capacitances of capacitors are not calculated uniquely. Further, a plurality of capacitors may further be connected between the LNB voltage supply line 15 and the ground.

What is claimed is:

1. An input circuit of a satellite tuner comprising:
   an antenna terminal for connecting to an outside converter via a cable;

a high pass filter for extracting a high frequency signal component from the outside converter transmitted via the cable and for transmitting the extracted high frequency signal to an initial stage circuit;

a power source supply line for connection to a power source for providing power for the outside converter via the cable:

a choke coil connected between the power source supply line and the antenna terminal for blocking the high frequency signal component from the outside converter transmitted via the cable and transmitting the power from the power source supply line to the antenna terminal;

a first capacitor connected between the power source supply line and ground for removing influence of a noise component included in the power transmitted by the power source supply line; and a second capacitor connected between the power source supply line and ground for removing influence of the high frequency signal component which leaks in via the choke coil, wherein a self-response frequency of the second capacitator is higher than a frequency of the high frequency signal inputted via the cable.

2. The input circuit of a satellite tuner according to claim 1, wherein a capacitance of the second capacitator is less than a capacitance of the first capacitor.

3. The input circuit of a satellite tuner according to claim 1, wherein the first and the second capacitors are constituted by chip parts.

4. The input circuit of a satellite tuner according to claim 3, wherein ceramic capacitors are used as the first and second capacitors.

5. The input circuit of a satellite tuner according to claim 1, wherein the choke coil is constituted by a pattern on a microstrip line.

6. The input circuit of a satellite tuner according to claim 1, wherein an F type connector is used as the antenna terminal.

7. The input circuit of a satellite tuner according to claim 1, wherein one end of the first capacitor and one end of the second capacitor are connected to a conductor pattern of the power supply line and other ends thereof pass through holes formed in a substrate having the conductor pattern formed thereon and are connected to a ground face on a rear side of the substrate.

8. An input circuit of a satellite tuner comprising:

an antenna terminal for connecting to an outside converter via a cable;

a high pass filter for extracting a high frequency signal component from the outside converter transmitted via the cable and for transmitting the extracted high frequency signal to an initial stage circuit;

a power source supply line for connection to a power source for providing power for the outside converter via the cable;

a choke coil connected between the power source supply line and the antenna terminal for block in a the high frequency signal component from the outside converter transmitted via the cable and transmitting the power from the power source supply line to the antenna terminal;

a first capacitor connected between the power source supply line and ground. for removing influence of a noise component included in the power transmitted by the power source supply line; and a second capacitor connected between the power source supply line and ground for removing influence of the high frequency signal component which leaks in via the choke coil, wherein a self-resonance frequency of the second capacitor is higher than a frequency of the high frequency signal inputted via the cable.

9. The input circuit of a satellite tuner according to claim 8, wherein a capacitance of the second capacitor is less than a capacitance of the first capacitor.

10. The input circuit of a satellite tuner according to claim 8, wherein a self-resonance frequency of the second capacitor is higher than a frequency of the high frequency signal inputted via the cable.

11. The input circuit of a satellite tuner according to claim 8, wherein the first and the second capacitors are constituted by chip parts.

12. The input circuit of a satellite tuner according to claim 8, wherein the choke coil is constituted by a pattern on a microstrip line.

13. The input circuit of a satellite tuner according to claim 8, wherein an F type connector is used as the antenna terminal.

14. The input circuit of a satellite tuner according to claim 13, wherein ceramic capacitors are used as the first and second capacitors.

15. The input circuit of a satellite tuner according to claim 8, wherein one end of the first capacitor and one end of the second capacitor are connected to a conductor pattern of the power supply line and the other ends thereof pass through holes formed in a substrate having the conductor pattern formed thereon and are connected to a ground face on a rear side of the substrate.

* * * * *